United States Patent
Sell et al.

(10) Patent No.: US 9,922,930 B2
(45) Date of Patent: *Mar. 20, 2018

(54) METHOD OF FORMING STACKED TRENCH CONTACTS AND STRUCTURES FORMED THEREBY

(71) Applicant: INTEL CORPORATION, Santa Clara, CA (US)

(72) Inventors: Bernhard Sell, Portland, OR (US); Oleg Golonzka, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/419,141

(22) Filed: Jan. 30, 2017

(65) Prior Publication Data

US 2017/0141039 A1    May 18, 2017

Related U.S. Application Data

(63) Continuation of application No. 15/220,270, filed on Jul. 26, 2016, now Pat. No. 9,559,060, which is a
(Continued)

(51) Int. Cl.
*H01L 21/70* (2006.01)
*H01L 23/535* (2006.01)
(Continued)

(52) U.S. Cl.
CPC ...... *H01L 23/535* (2013.01); *H01L 21/28052* (2013.01); *H01L 21/28123* (2013.01);
(Continued)

(58) Field of Classification Search
CPC ............ H01L 21/768; H01L 21/76802; H01L 21/76804; H01L 21/76805;
(Continued)

(56) References Cited

U.S. PATENT DOCUMENTS

| 6,004,878 A | 12/1999 | Thomas et al. |
| 6,163,067 A | 12/2000 | Inohara et al. |

(Continued)

FOREIGN PATENT DOCUMENTS

| CN | 1501472 A | 6/2004 |
| CN | 1619793 A | 5/2005 |

(Continued)

OTHER PUBLICATIONS

Decision on Reexamination from the P.R. China State Intellectual Property Office for Chinese Patent Application No. 200980110704.1 dated Mar. 19, 2015 and English Translation thereof.
(Continued)

*Primary Examiner* — Thanh Y Tran
(74) *Attorney, Agent, or Firm* — Finch & Maloney PLLC

(57) ABSTRACT

Methods and associated structures of forming a microelectronic device are described. Those methods may include forming a structure comprising a first contact metal disposed on a source/drain contact of a substrate, and a second contact metal disposed on a top surface of the first contact metal, wherein the second contact metal is disposed within an ILD disposed on a top surface of a metal gate disposed on the substrate.

20 Claims, 4 Drawing Sheets

Related U.S. Application Data continuation of application No. 14/994,109, filed on Jan. 12, 2016, now Pat. No. 9,437,546, which is a continuation of application No. 14/581,498, filed on Dec. 23, 2014, now Pat. No. 9,252,267, which is a continuation of application No. 14/284,808, filed on May 22, 2014, now Pat. No. 9,293,579, which is a continuation of application No. 12/215,991, filed on Jun. 30, 2008, now Pat. No. 8,803,245.

(51) Int. Cl.
| | |
|---|---|
| H01L 21/768 | (2006.01) |
| H01L 23/485 | (2006.01) |
| H01L 23/522 | (2006.01) |
| H01L 21/28 | (2006.01) |
| H01L 29/49 | (2006.01) |
| H01L 29/66 | (2006.01) |
| H01L 29/78 | (2006.01) |
| H01L 21/8234 | (2006.01) |
| H01L 23/528 | (2006.01) |
| H01L 23/532 | (2006.01) |
| H01L 27/088 | (2006.01) |
| H01L 29/08 | (2006.01) |
| H01L 29/417 | (2006.01) |

(52) U.S. Cl.
CPC .. *H01L 21/76805* (2013.01); *H01L 21/76889* (2013.01); *H01L 21/76895* (2013.01); *H01L 21/76897* (2013.01); *H01L 21/823425* (2013.01); *H01L 21/823468* (2013.01); *H01L 21/823475* (2013.01); *H01L 23/485* (2013.01); *H01L 23/528* (2013.01); *H01L 23/5226* (2013.01); *H01L 23/53257* (2013.01); *H01L 23/53266* (2013.01); *H01L 27/088* (2013.01); *H01L 29/0847* (2013.01); *H01L 29/4175* (2013.01); *H01L 29/4925* (2013.01); *H01L 29/66666* (2013.01); *H01L 29/7827* (2013.01); *H01L 2924/0002* (2013.01)

(58) Field of Classification Search
CPC ......... H01L 21/76807; H01L 21/76897; H01L 21/823418; H01L 21/823814
See application file for complete search history.

(56) References Cited

U.S. PATENT DOCUMENTS

| | | | |
|---|---|---|---|
| 6,403,996 B1 | 6/2002 | Lee | |
| 6,759,720 B2 | 7/2004 | Shinkawata | |
| 7,064,375 B2 | 6/2006 | Yonehama et al. | |
| 7,875,550 B2 * | 1/2011 | Costrini | H01L 21/76829 257/E21.577 |
| 7,879,718 B2 | 2/2011 | Chan | |
| 2001/0048624 A1 | 12/2001 | Morimoto | |
| 2002/0070398 A1 | 6/2002 | Lee | |
| 2004/0043542 A1 | 3/2004 | Park et al. | |
| 2004/0253811 A1 | 12/2004 | Lee et al. | |
| 2005/0059236 A1 | 3/2005 | Nishida et al. | |
| 2005/0087787 A1 | 4/2005 | Ando | |
| 2005/0140002 A1 | 6/2005 | Shin et al. | |
| 2005/0287799 A1 | 12/2005 | Lee et al. | |
| 2006/0189051 A1 | 8/2006 | Kim | |
| 2006/0234446 A1 | 10/2006 | Wei et al. | |
| 2006/0258145 A1 | 11/2006 | Lee et al. | |
| 2007/0045623 A1 | 3/2007 | Jin | |
| 2007/0262393 A1 | 11/2007 | Yoon et al. | |
| 2008/0191352 A1 | 8/2008 | Yu et al. | |

FOREIGN PATENT DOCUMENTS

| | | |
|---|---|---|
| CN | 1713368 A | 12/2005 |
| CN | 101114650 A | 1/2008 |
| JP | H07263551 A | 10/1995 |
| JP | H0955499 A | 2/1997 |
| JP | H09162387 A | 6/1997 |
| JP | H1126757 A | 1/1999 |
| JP | 2000031298 A | 1/2000 |
| JP | 2005005669 A | 1/2005 |
| JP | 2005026641 A | 1/2005 |
| JP | 2006013424 A | 1/2006 |
| JP | 2007134705 A | 5/2007 |
| JP | 2007141905 A | 6/2007 |
| JP | 2007165872 A | 6/2007 |
| KR | 10-2005-0079795 A | 8/2005 |
| WO | 2010002718 A2 | 1/2010 |
| WO | 2010002718 A3 | 5/2010 |

OTHER PUBLICATIONS

International Preliminary Report on Patentability and Written Opinion received for PCT Patent Application No. PCT/US2009/048764, dated Jan. 13, 2011, 8 pages.
International Search Report and Written Opinion received for PCT Patent Application No. PCT/US2009/048764, dated Feb. 3, 2010, 13 pages.
Notice of Allowance received for Japanese Patent Application No. 2011-509802, dated Dec. 3, 2013, 1 page of NOA only.
Notice of Allowance received for Korean Patent Application No. 10-20107021369 dated Jan. 3, 2013, 1 page of English Translation and 2 pages of Korean NOA.
Notice of Allowance received for U.S. Appl. No. 12/215,991, dated Apr. 17, 2014, 12 pages.
Office Action received for Chinese Patent Application No. 200980110704.1 dated Apr. 9, 2013, 8 pages of English Translation and 4 pages of Chinese Office Action.
Office Action received for Chinese Patent Application No. 200980110704.1 dated Aug. 8, 2012, 7 pages of English Translation and 4 pages of Chinese Office Action.
Office Action received for Chinese Patent Application No. 200980110704.1 dated Jul. 9, 2014, 16 pages of Office Action including 9 pages of English Translation.
Office Action received for Chinese Patent Application No. 200980110704.1 dated Sep. 23, 2011, 10 pages of English Translation and 5 pages of Chinese Office Action.
Office Action received for Japanese Patent Application No. 2011-509802, dated Aug. 6, 2013, 2 pages of English Translation and 2 pages of Japanese Office Action.
Office Action received for Japanese Patent Application No. 2011-509802, dated Dec. 18, 2012, 4 pages of English Translation and 3 pages of Japanese Office Action.
Office Action received for Korean Patent Application No. 10-20107021369 dated Nov. 25, 2011, 4 pages of English Translation only.
Office Action received for Korean Patent Application No. 10-20107021369 dated Oct. 17, 2012, 2 pages of English Translation only.
Office Action received for Chinese Appl. No. 201510028714.8. dated Mar. 2, 2017, 16 pages, including English translation.
Office Action and Search Report received for Chinese Patent Application No. 201510028716.7.1 dated Jul. 18, 2017, 10 pages of English Translation and 7 pages of Chinese Office Action.

* cited by examiner

METHOD OF FORMING STACKED TRENCH CONTACTS AND STRUCTURES FORMED THEREBY

RELATED APPLICATIONS

This application is a continuation of application Ser. No. 15/220,270, filed Jul. 26, 2016, now U.S. Pat. No. 9,559,060, which is a continuation of application Ser. No. 14/994,109, filed Jan. 12, 2016, now U.S. Pat. No. 9,437,546, which is continuation of application Ser. No. 14/581,498, filed Dec. 23, 2014, now U.S. Pat. No. 9,252,267, which is a continuation of application Ser. No. 14/284,808, filed May 22, 2014, now U.S. Pat. No. 9,293,579, which is a continuation of application Ser. No. 12/215,991, filed Jun. 30, 2008, now U.S. Pat. No. 8,803,245. Each of these applications is incorporated herein by reference in its entirety.

BACKGROUND

Contact to gate shorts become an increasingly difficult problem for integrated circuits with scaled dimensions. While a metal gate process which forms a salicide through the contact hole may be beneficial in reducing such shorts, a contact process that increases the contact to gate registration margin is necessary to further reduce the contact to gate shorts to a manufacturable level.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION

Figure 1A:
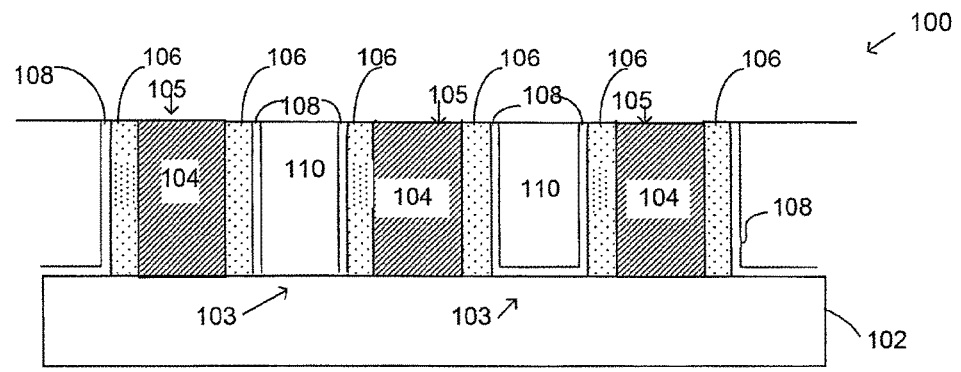
FIGS. 1a-1g represents structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic structure are described. Those methods may include forming a contact opening in a first ILD disposed on a substrate, wherein a source/drain contact area is exposed, forming a silicide on the source/drain contact area, forming a first contact metal in the contact opening to fill the contact opening, polishing the first contact metal to planarize a top surface of the first contact metal with a top surface of a gate disposed on the substrate, depositing a second ILD on the top surface of the gate, forming a second contact opening in the second ILD, and forming a second contact metal in the second contact opening, wherein the first and second contact openings are conductively coupled. Methods of the present invention increase the contact to gate registration margin and reduce contact to gate shorts.

Methods of the present invention are depicted in FIGS. 1a-1g. FIG. 1a shows a cross section of a portion of a transistor structure 100 comprising a substrate 102, and a gate 104, which may comprise a metal gate in some embodiments, and may comprise such metal gate materials as hafnium, zirconium, titanium, tantalum, or aluminum, or combinations thereof, for example. The gate 104 may comprise a top surface 105. The substrate 102 may be comprised of materials such as, but not limited to, silicon, silicon-on-insulator, germanium, indium antimonide, lead telluride, indium arsenide, indium phosphide, gallium arsenide, gallium antimonide, or combinations thereof.

The transistor structure 100 may further comprise a spacer material 106, that may be adjacent and in direct contact with the gate 104. The spacer material 106 may comprise a dielectric material in some cases, such as but not limited to silicon dioxide and/or silicon nitride materials. The transistor structure 100 may further comprise a nitride etch stop layer (nesl) 108, that may be adjacent and in direct contact with the spacer material 106. The nesl 108 may serve as an etch stop layer in some embodiments. The transistor structure 100 may further comprise a first interlayer dielectric (ILD) 110 that may serve as an isolation layer in some embodiments, and may be disposed adjacent to and in direct contact with the nesl 108 in some cases.

Figure 1B:
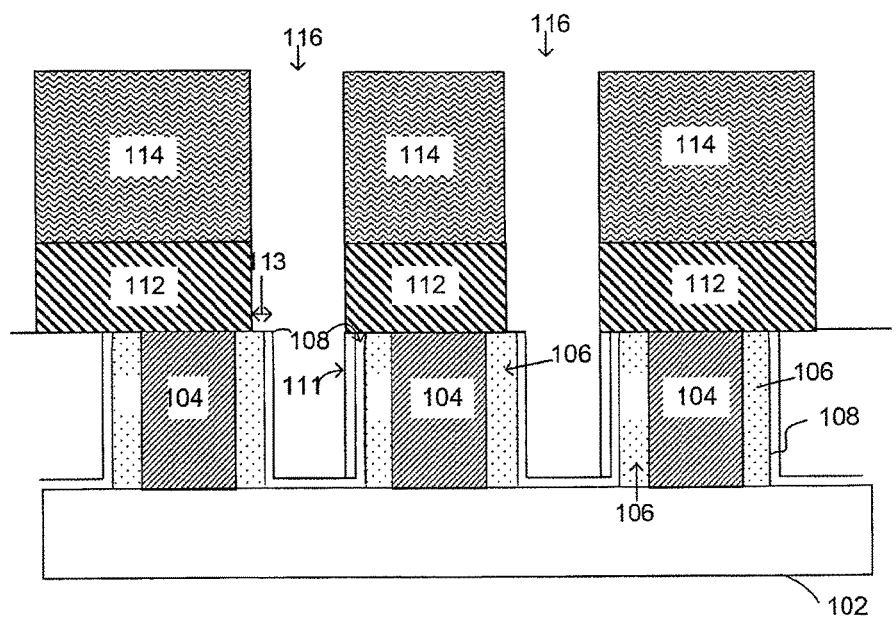

A sacrificial stopping layer 112 may be formed on the top surface 105 of the gate 104, that may comprise a nitride and/or a silicon carbide material in some cases (FIG. 1b). A resist layer 114 may be formed on the stopping layer 112 utilizing any suitable patterning process, such as a photolithography process, for example. The resist layer 114 may be formed to define an opening 116, such as a trench contact opening 115, for a source/drain region 103 of the substrate 100. A portion of the stopping layer 112 and a portion of the ILD 110 may be disposed on top surfaces of the gate 104, the adjacent spacer material and on the adjacent nesl that are disposed on the substrate.

In an embodiment, a dry etch process may be utilized to form the opening 116, in which portions of the stopping layer 112 and the first ILD 110 may be removed. In an embodiment, the etching process may comprise an oxide etch that may be selective to the nitride etch stop layer (nesl) 108 and to the spacer material 106, and may remove the first ILD 110 in a substantially anisotropic manner, leaving the nesl 108 and the spacer material 106 substantially intact. In other words, the oxide ILD may etch at a much higher etch rate in the etch process chemistry than the spacer material 106 and the nesl 108. In an embodiment, a portion of the stopping layer 112 and a portion of the ILD 110 may be removed that are disposed on top surfaces of the gate 104, the an adjacent spacer 106, and on the adjacent nesl 108, to form the contact opening 116.

The patterning process may result in a mis-registration of the resist layer 114, wherein the resist layer 114 may be mis-aligned so that a portion 113 of the spacer material 106 may be exposed during the formation of the opening 115, and a portion 111 of the first ILD 110 may remain covered with the resist layer 114. The amount of mis-registration of the resist layer 114 may vary depending upon the particular application, but may become more significant as the aspect ratio of the opening 116 increases. For example, microelectronic devices comprising small geometries will be more likely to form a short between the contact and the gate due to resist layer 114 mis-alignment.

Figure 1C:
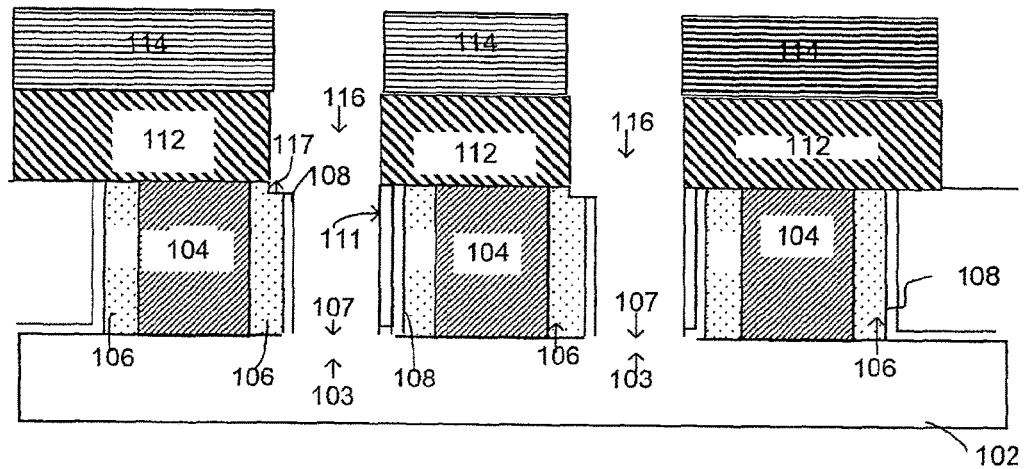

Subsequently, the nitride etch stop layer 108 may be removed that is disposed on a portion of the source/drain region 103 of the substrate 100 utilizing a nitride etching process, for example, so that a source/drain contact area 107 may be exposed (FIG. 1c). Alternatively, the nitride etch stop layer 108 may not be present on the substrate 102, and thus the nesl 108 will not need to be removed. In another embodiment, the nesl etch may be optional, depending on the selectivity of the ILD removal process, such that when the ILD etch is selective to the substrate, the nesl etch does not need to be performed.

Figure 1D:
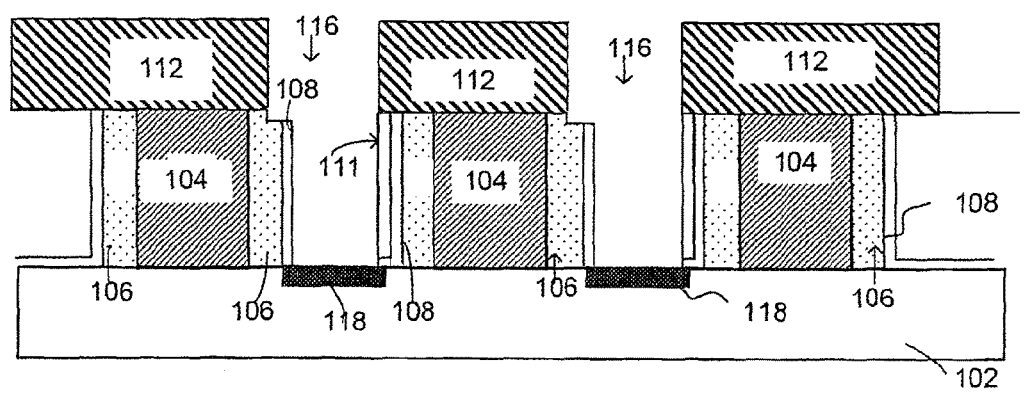

A depth 117 into the exposed portion 113 of the spacer material 106 may be formed by the nesl 108 etch and/or the ILD etch due to the mis-registration of the resist layer 114. The depth 117 that may be created may vary depending upon the particular process parameters. In an embodiment, the depth 117 correlates/corresponds to an etch time of the contact etch (nesl and/or ILD etch). The resist layer 114 may then be removed and a salicide 118 may be formed on/in the source/drain contact area 107 using any suitable salicide process as are known in the art, such as but not limited to a nickel salicide process and/or other such salicide process (FIG. 1d).

Figure 1E:
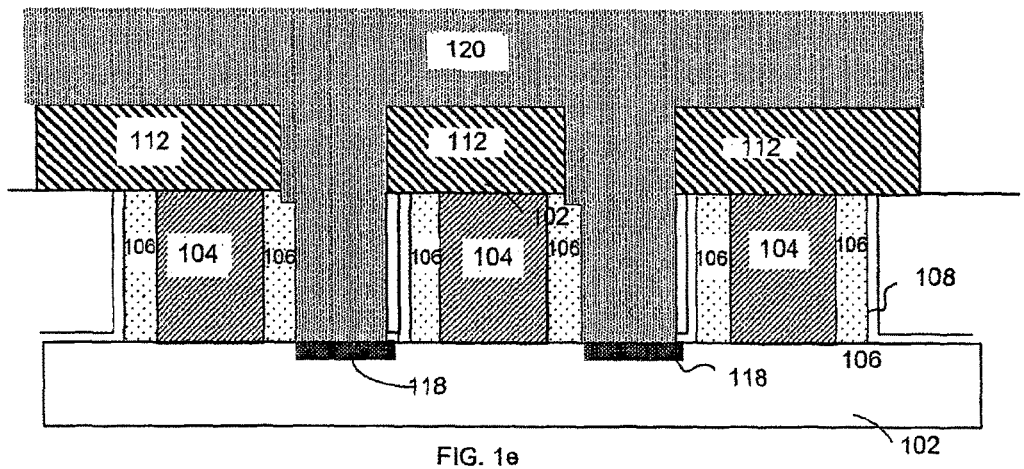
Figure 1F:
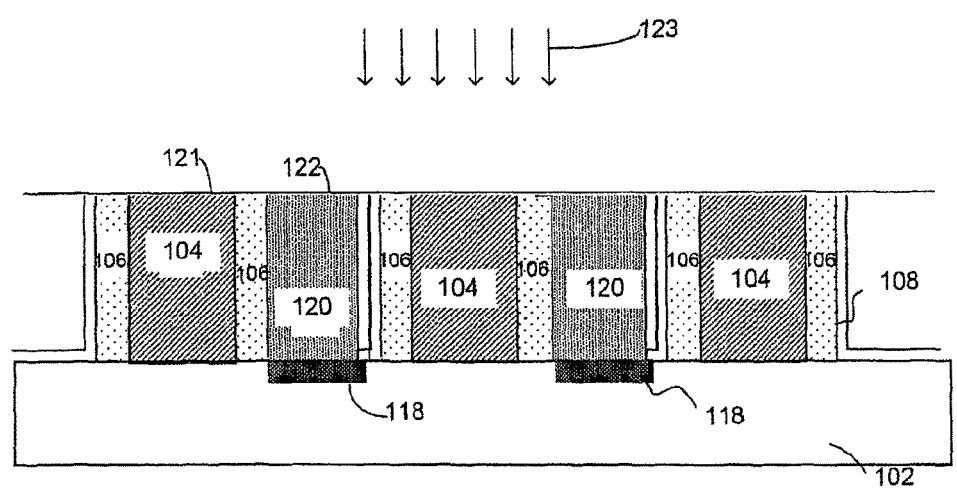

A first contact metal 120 may be formed on the salicide 118 and may fill the opening 116 (FIG. 1e). In an embodiment, the first contact metal 120 may be formed utilizing a process possessing good gap fill properties to ensure that there are little to no voids formed in the contact opening 116. Such a process may include a chemical vapor deposition (CVD) process, for example. A polishing process 123 may subsequently be performed, such as a chemical mechanical polishing (CMP) process, for example, to remove the first contact metal 120 (FIG. 1f) and the stopping layer 112. The first contact metal may comprise at least one of tungsten, titanium, titanium nitride and titanium tungsten in some cases, but may comprise any suitable contact material, according to the particular application.

In an embodiment, the first contact metal 120 may be planarized with a planarized top surface 121 of the gate 104, i.e., it may be polished by the polishing process 123 so that a top surface 122 of the first contact metal 120 may be planar with the planarized top surface 121 of the gate 104. The polishing process 123 needs to comprise a sufficient amount of over-polish time so that any stringers that could connect the contact metal 120 with the gate 104 are removed. The polishing process 123 additionally removes the depth 117 of the exposed portion 113 of the spacer material 106 that was due to the mis-registration of the resist layer 114 (referring back to FIG. 1c). In an embodiment, the first contact metal 120 may comprise a non-tapered first contact metal 120.

Figure 1G:
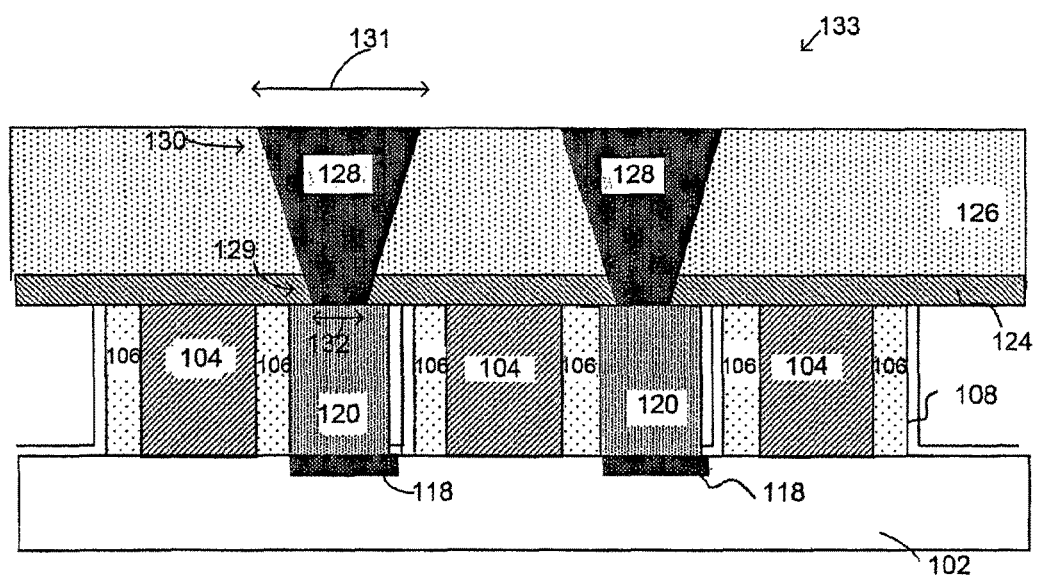

An additional gate etch stop layer 124 may be formed on the planarized top surface 121 of the gate 104, and on the top surface 122 of the contact metal 120 (FIG. 1g). A second ILD 126 may be formed on the additional gate etch stop layer 124. A second opening may be formed (not shown) that may be filled with a second contact metal 128, that may be conductively coupled and may form an ohmic contact with the first contact metal 120, and that may be disposed on the top surface 122 of the first contact metal. The second opening may be formed such that the second contact metal 128 can be tapered and a bottom portion 129 of the second contact metal 128 can be very small compared to a top portion 130 of the second contact metal 128, since the salicide does not have to be formed through this second opening.

In an embodiment, the top portion 130 comprises a larger diameter 131 than a diameter 132 of the bottom portion 129 of the second contact metal 128. The large taper of the second contact metal 128 may increase the contact-to-gate registration window significantly compared to prior art single contact processes. Thus, a stacked contact structure 133 may be formed that is higher than the gate 104. The metal to metal contact of the first contact structure 120 and the second contact structure 128 affords much more flexibility on the shape of the stacked contact structure 133 (that may comprise a vertically stacked dual contact structure) within a transistor structure, thus increasing the amount of mis-registration error process window without creating the possibility of touching (shorting) the gate 104.

Embodiments of the present invention enable a simple, unique method for integrating a stacked trench contact with a metal gate process, such as a dual metal gate process, for example, that increases contact to gate registration margin and decreases the aspect ratio of the contact during a salicide process.

In an embodiment, the source drain trench contact structure consists of two vertically stacked contacts. The metal gate may be formed before the first source/drain contact, a salicide may be formed after the first source/drain contact is opened and before the second source/drain contact opening is formed.

Prior art contact processes have used a single trench contact process, which may not be scalable to very small technology nodes.

Further advantages of this invention include the enabling of the formation of larger contacts with better contact to gate registration margin with relatively small process changes as compared with prior art processing. The embodiments of the present invention allow for an increased process window for contact mis-alignment that will not lead to a change in overlap capacitance of a microelectronic device, such as a transistor, fabricated according to the methods of the present invention.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that certain aspects of microelectronic structures are well known in the art. Therefore, it is appreciated that the Figures provided herein illustrate only portions of exemplary microelectronic structures that pertain to the practice of the present invention. Thus the present invention is not limited to the structures described herein.

What is claimed is:

1. A semiconductor structure, comprising:
   a gate electrode;
   a source region, on a first side of the gate electrode;
   a drain region, on a second side of the gate electrode opposite the first side;
   a first dielectric sidewall spacer adjacent to the first side of the gate electrode;
   a second dielectric sidewall spacer adjacent to the second side of the gate electrode;

a nitride dielectric material laterally adjacent at least one of the first and second dielectric sidewall spacers, wherein the nitride dielectric material, the at least one of the first and second dielectric sidewall spacers, and the gate electrode each have an uppermost surface;

an interlayer dielectric material laterally adjacent the nitride dielectric material;

a dielectric cap layer on the nitride dielectric material, on the first and second dielectric sidewall spacers, on the gate electrode, and over at least a portion of the interlayer dielectric material;

a conductive contact structure in contact with one of the source region or the drain region; and a conductive via structure over and in contact with the conductive contact structure, the conductive via structure having an upper portion wider than a lower portion, wherein the conductive contact structure is wider than the conductive via structure at a location where the conductive contact structure and the conductive via structure meet, and wherein the location is below an uppermost surface of the dielectric cap layer.

2. The semiconductor structure of claim 1, wherein the gate electrode comprises titanium.

3. The semiconductor structure of claim 1, wherein the gate electrode comprises titanium and aluminum.

4. The semiconductor structure of claim 1, wherein the first and second dielectric sidewall spacers comprise silicon and nitrogen.

5. The semiconductor structure of claim 4, wherein the first and second dielectric sidewall spacers further comprise silicon and oxygen.

6. The semiconductor structure of claim 5, wherein the nitride dielectric material is in direct contact with the at least one of the first and second dielectric sidewall spacers.

7. The semiconductor structure of claim 1, wherein the dielectric cap layer comprises a nitride material.

8. The semiconductor structure of claim 1, further comprising:
a first silicide on the source region, and a second silicide on the drain region, the first and second silicides comprising nickel.

9. The semiconductor structure of claim 1, wherein the conductive contact structure comprises tungsten.

10. The semiconductor structure of claim 9, wherein the conductive via structure comprises tungsten.

11. The semiconductor structure of claim 1, wherein at least one of the nitride dielectric material and the dielectric cap layer provides a nitride etch stop.

12. The semiconductor structure of claim 11, wherein the nitride etch stop has an etch selectivity different from the interlayer dielectric material.

13. A method of fabricating a semiconductor structure, the method comprising:
forming a gate electrode;
forming a source region, on a first side of the gate electrode;
forming a drain region, on a second side of the gate electrode opposite the first side;
forming a first dielectric sidewall spacer adjacent to the first side of the gate electrode;
forming a second dielectric sidewall spacer adjacent to the second side of the gate electrode;
depositing a nitride dielectric material laterally adjacent at least one of the first and second dielectric sidewall spacers, wherein the nitride dielectric material, the at least one of the first and second dielectric sidewall spacers, and the gate electrode each have an uppermost surface;
depositing an interlayer dielectric material laterally adjacent the nitride dielectric material;
forming a dielectric cap layer on the nitride dielectric material, on the first and second dielectric sidewall spacers, on the gate electrode, and over at least a portion of the interlayer dielectric material;
forming a conductive contact structure in contact with one of the source region or the drain region; and
forming a conductive via structure over and in contact with the conductive contact structure, the conductive via structure having an upper portion wider than a lower portion, wherein the conductive contact structure is wider than the conductive via structure at a location where the conductive contact structure and the conductive via structure meet, and wherein the location is below an uppermost surface of the dielectric cap layer.

14. The method of claim 13, wherein the gate electrode comprises titanium.

15. The method of claim 13, wherein the gate electrode comprises titanium and aluminum.

16. The method of claim 13, wherein the first and second dielectric sidewall spacers comprise silicon nitride.

17. The method of claim 16, wherein the first and second dielectric sidewall spacers further comprise silicon dioxide.

18. The method of claim 17, wherein the nitride dielectric material is in direct contact with the silicon dioxide portion of the at least one of the first and second dielectric sidewall spacers.

19. The method of claim 13, wherein the dielectric cap layer comprises a nitride material.

20. The method of claim 13, further comprising:
forming a first silicide on the source region, and a second silicide on the drain region, the first and second silicides comprising nickel.

* * * * *